United States Patent
Glenn (10) Patent No.: US 7,064,618 B2
(45) Date of Patent: Jun. 20, 2006

(54) PLL WITH SWAPPABLE TUNING LOOPS

(75) Inventor: Robert C. Glenn, Bend, OR (US)

(73) Assignee: Intel Corporation, Santa Clara, CA (US)

( * ) Notice: Subject to any disclaimer, the term of this patent is extended or adjusted under 35 U.S.C. 154(b) by 305 days.

(21) Appl. No.: 10/675,152

(22) Filed: Sep. 29, 2003

(65) Prior Publication Data

US 2005/0068113 A1   Mar. 31, 2005

(51) Int. Cl.
*H03L 7/099*   (2006.01)

(52) U.S. Cl. .................... 331/17; 331/179; 331/36 C; 327/156; 455/260

(58) Field of Classification Search ............ 331/179, 331/36 C, 177 V, 17, 44; 327/156, 157; 360/51; 375/376; 455/75, 76, 260; 332/127
See application file for complete search history.

(56) References Cited

U.S. PATENT DOCUMENTS

| | | | | |
|---|---|---|---|---|
| 5,991,312 A | * | 11/1999 | Koenig et al. ............... 370/535 |
| 6,330,683 B1 | * | 12/2001 | Jeddeloh ..................... 713/401 |
| 2001/0020875 A1 | * | 9/2001 | Jansson ....................... 331/44 |
| 2002/0008589 A1 | * | 1/2002 | Lanoman et al. ............ 331/34 |
| 2002/0135428 A1 | * | 9/2002 | Gomez ........................ 331/17 |
| 2002/0167362 A1 | * | 11/2002 | Justice et al. ................ 331/11 |

* cited by examiner

*Primary Examiner*—Joseph Chang
(74) *Attorney, Agent, or Firm*—Buckley, Maschoff & Talwalkar LLC (57) ABSTRACT

Some embodiments provide a switch capacitor circuit to generate a first output capacitance based on a control signal, a main loop circuit to generate an output signal based on the control signal, and an oscillating circuit to generate an oscillating signal, a frequency of the oscillating signal based at least on the first output capacitance and the output signal.

16 Claims, 6 Drawing Sheets

PLL WITH SWAPPABLE TUNING LOOPS

CROSS-REFERENCE TO RELATED APPLICATIONS

The present application is related to commonly-assigned and co-pending application Ser. No.10/673,803, entitled PLL WITH MULTIPLE TUNING LOOPS, and filed concurrently herewith.

BACKGROUND

A Phase-Locked Loop (PLL) may be used to generate an output signal having a desired frequency, such as a clock signal. A PLL might "lock" to the desired frequency by receiving its output signal via a feedback loop, determining a difference between the output signal and a reference signal, and changing its transfer function in order to reduce the difference.

PLL design often involves trade-offs between tuning range and noise immunity. More specifically, some conventional PLL designs provide a wide range of output frequencies while exhibiting poor noise immunity, while others provide a narrow range of output frequencies while exhibiting good noise immunity. PLL designs that may provide suitable response characteristics within a range of normal operating frequencies are desired.

DETAILED DESCRIPTION

Figure 1:
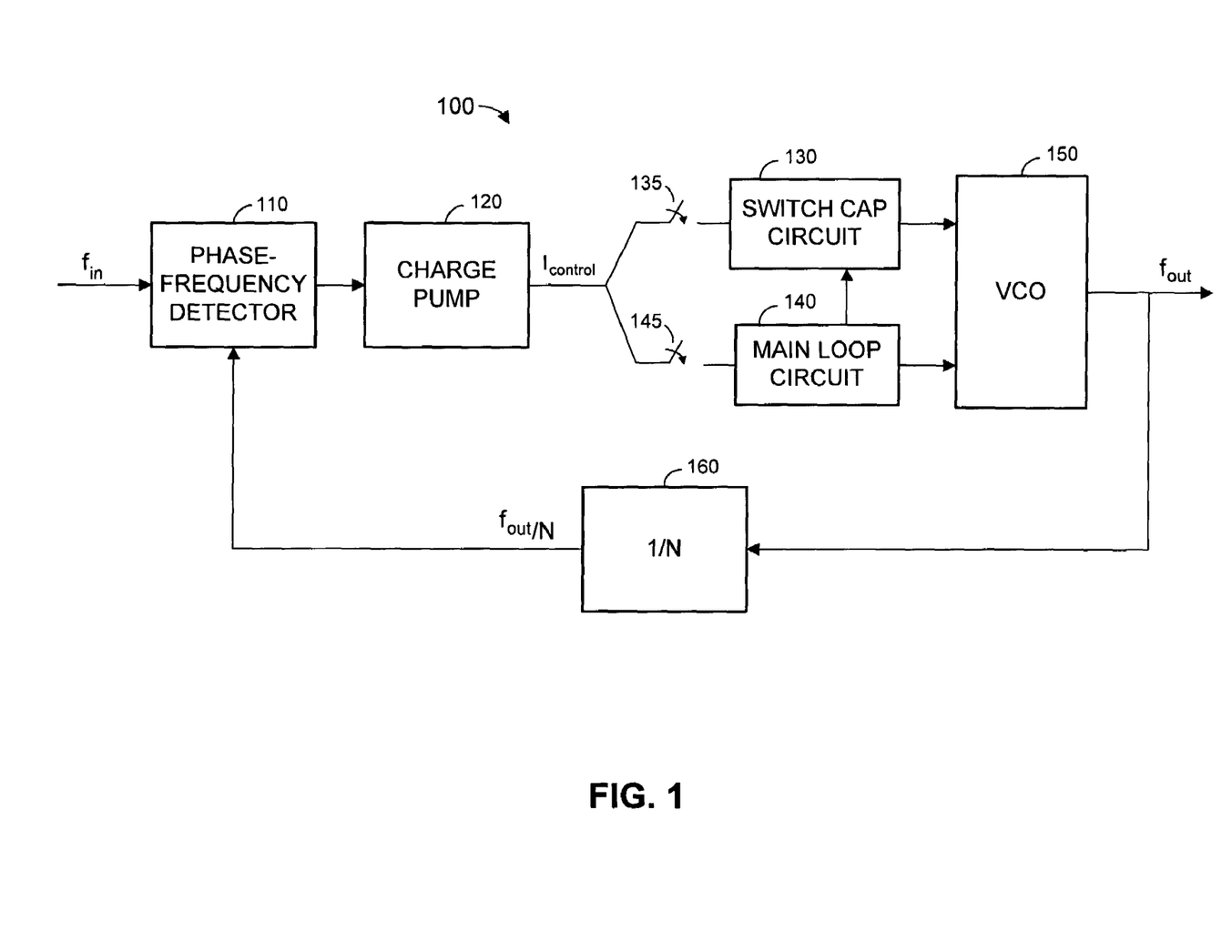
FIG. 1 is a block diagram of a PLL according to some embodiments.

FIG. 1 is a block diagram of PLL 100 according to some embodiments. PLL 100 comprises phase-frequency detector 110, charge pump 120, switch capacitor circuit 130 and associated switch 135, main loop circuit 140 and associated switch 145, VCO 150, and feedback divider 160. PLL 100 may generate an oscillating signal $f_{out}$ having a frequency that is based on a reference frequency represented by input signal $f_{in}$. In some embodiments, the reference frequency is equal to the frequency of input signal $f_{in}$, and PLL 100 locks the frequency of $f_{out}$ to $N(f(f_{in}))$.

Generally, according to some embodiments, switch capacitor circuit 130 is coupled to control signal $I_{control}$ by closing switch 135. Next, an output capacitance of switch capacitor circuit 130 is determined to be oscillating, and switch 135 is opened to uncouple switch capacitor circuit 130 from control signal $I_{control}$ to set a first output capacitance of switch capacitor circuit 130. Main loop circuit 140 is then coupled to control signal $I_{control}$ by closing switch 145. The foregoing process may provide a wider tuning range and better response over a target range of frequencies than previously available. Details of the process according to some embodiments will be set forth below.

Returning to the elements of PLL 100, detector 110 may determine a difference between the frequency or phase of two signals and transmit a signal to charge pump 120 based on the determined difference. Charge pump 120 generates and transmits control signal $I_{control}$ based on the signal received from detector 110. In some embodiments, detector 110 receives reference signal $f_{in}$ having frequency ($f(f_{in})$), and signal $f_{out}/N$ having frequency $f(f_{out})/N$. In this regard, feedback divider 160 may operate to divide the frequency or phase of signal $f_{out}$ by N prior to transmitting the signal to detector 110. Detector 110 compares the frequencies of the two received signals and transmits a signal indicating the results of the comparison to charge pump 120.

Charge pump 120 generates control signal $I_{control}$ in response to the signal. Charge pump 120 may generate control signal $I_{control}$ to source current if $f(f_{out}/N)$ is greater than $f(f_{in})$, and may generate control signal $I_{control}$ to sink current if $f(f_{out}/N)$ is greater than $f(f_{in})$.

Control signal $I_{control}$ may be transmitted to switch capacitor circuit 130 or to main loop circuit 140 depending on the state of switches 135 and 145. Circuit 130 may change its contribution to a frequency-controlling capacitance of VCO 150 if control signal $I_{control}$ is transmitted to switch capacitor circuit 130. On the other hand, main loop circuit 140 may change the voltage of a signal output to VCO 150 if control signal $I_{control}$ is transmitted to main loop circuit 140. In response to either case, VCO 150 may change a frequency of oscillating signal $f_{out}$ so as to reduce the difference between $f(f_{out}/N)$ and $f(f_{in})$.

Figure 2:
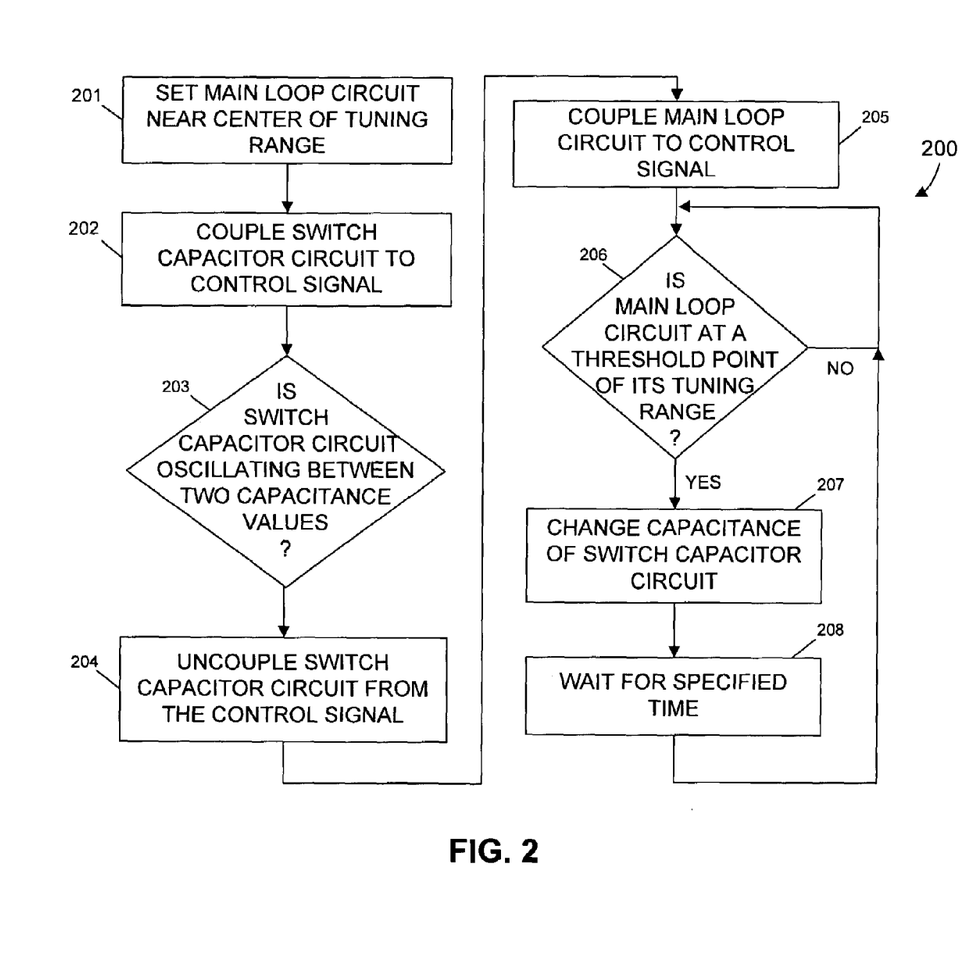
FIG. 2 is a flow diagram of a process for tuning a PLL according to some embodiments.

FIG. 2 is a diagram of process 200 according to some embodiments. Process 200 may be executed to tune a PLL to a desired output frequency. Process 200 may be executed by a digital state machine and/or other hardware and software coupled to PLL 100. One or more elements of process 200 may be executed by one or more elements of PLL 100.

At 201, main loop circuit 140 is set to operate near the center of its tuning range. For example, main loop circuit 140 may generate and transmit a voltage signal having a particular range of values during operation. Internal elements of main loop circuit 140 may therefore be controlled at 201 so as to generate a voltage signal having a voltage near the center of the range of values. Any currently- or hereafter-known PLL main loop circuit (often referred to as a "loop filter") and/or technique for setting such a circuit to operate near the center of its tuning range may be used at 201 in some embodiments.

Switch capacitor circuit 130 is coupled to control signal $I_{control}$ at 202. Coupling switch capacitor circuit 130 to control signal $I_{control}$ may comprise closing switch 135. According to some embodiments, both switches 135 and 145 are open prior to 201. The terms "couple" and "decouple" as used herein may refer to the creation and destruction of electrical connections between two elements and/or between an element and a signal, using a switch or other systems.

The elements of PLL 100 are allowed to operate freely after 202. Accordingly, as described above, phase-frequency detector 110 receives reference signal $f_{in}$ that represents a reference frequency and receives a signal having a frequency $f(f_{out}/N)$ that is based on the frequency $f(f_{out})$ of the oscillating signal output by VCO 150. In some embodiments, a frequency $f(f_{in})$ of the reference signal $f_{in}$ is equal to the reference frequency. In some embodiments, reference signal $f_{in}$ may otherwise represent the reference frequency, such as by encoding a code that is resolved by detector 110 to arrive at the reference frequency. Similarly, the other signal received by detector 110 may have a frequency that is equal to or a factor of the frequency of the oscillating signal output by VCO 150. According to some embodiments, the other received signal otherwise encodes information indicating the frequency of the oscillating signal.

Detector 110 determines a difference between the two frequencies and transmits a signal to charge pump 120 based on the difference. The difference may be equal to the mathematical difference between the two frequencies or it may be expressed in any other terms that can represent how the two frequencies differ from one another. The terms in which the difference is expressed may depend upon the type of input that is expected by charge pump 120.

In this regard, the signal received by charge pump 120 may indicate the mathematical difference between the two frequencies. The signal may also or alternatively indicate a percentage change required in the frequency of the oscillating signal. In some embodiments, the signal indicates the desired magnitude and/or frequency of control signal $I_{control}$.

Charge pump 120 generates control signal $I_{control}$ based on the signal received from detector 110. Accordingly, charge pump 120 generates control signal $I_{control}$ based on the frequency of the oscillating signal and on the reference frequency. In the present example, control signal $I_{control}$ is transmitted to switch capacitor circuit 130 because circuit 130 is coupled to control signal $I_{control}$ at 202. An output capacitance of switch capacitor circuit 130 then changes in response to control signal $I_{control}$ in order to reduce any difference between $f(f_{out}/N)$ and $f(f_{in})$. Switch capacitor circuit 130 continues to change its output capacitance based on control signal $I_{control}$ until it is determined at 203 that the output capacitance is oscillating (dithering) between two capacitance values.

Figure 3:
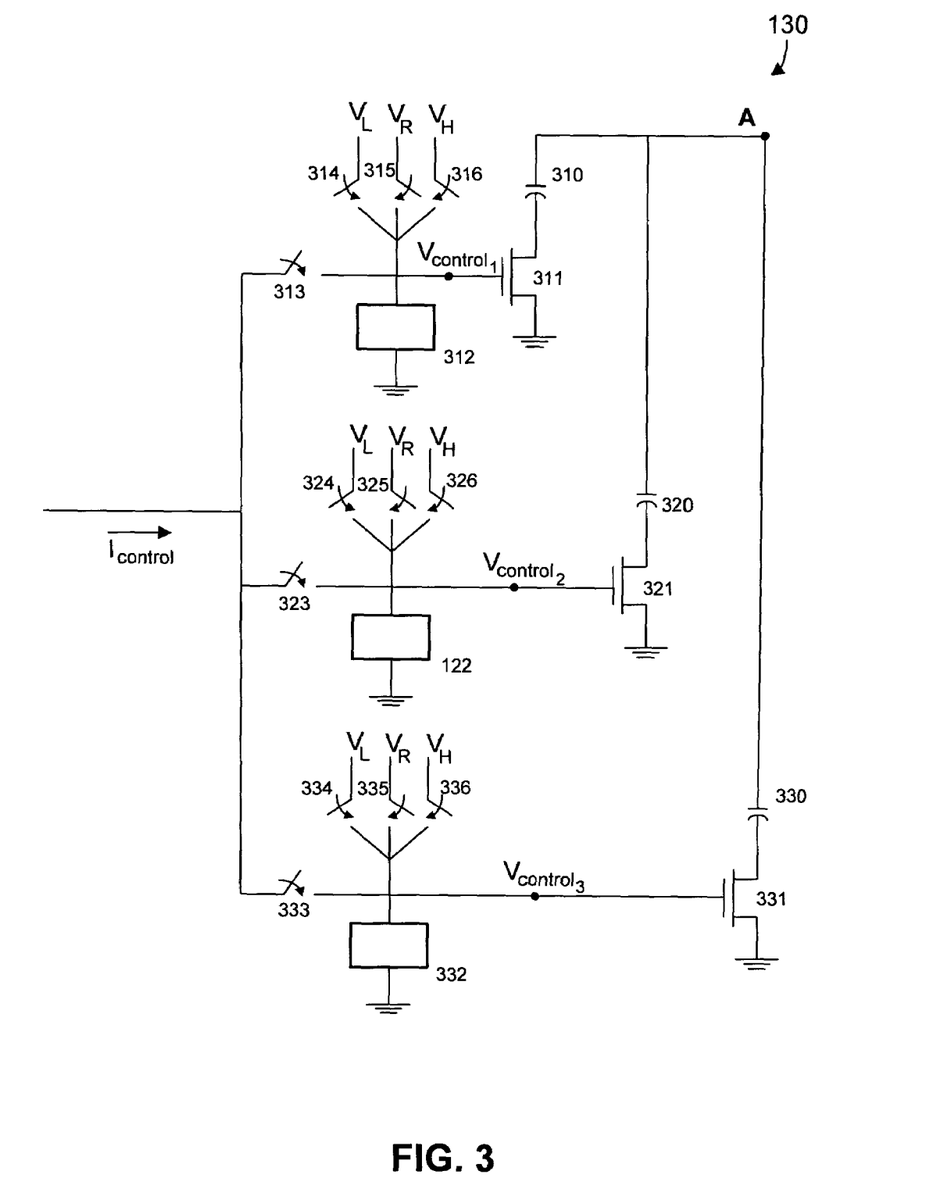
FIG. 3 is a schematic diagram of a switch capacitor circuit according to some embodiments.

Any circuit for contributing a capacitance to VCO 150 that is based on control signal $I_{control}$ may be used as switch capacitor circuit 130 in conjunction with some embodiments. FIG. 3 is a schematic diagram of circuit 130 according to some embodiments. Circuit 130 is described in detail in commonly-owned, co-pending U.S. patent application Ser. No. 10/601,509, entitled SYSTEM TO VARY CAPACITANCE BASED ON A CONTROL SIGNAL and filed on Jun. 23, 2003, the contents of which are incorporated herein by reference. Accordingly, a general description thereof follows below.

Circuit 130 includes capacitors 310, 320 and 330 coupled in parallel. Capacitors 310, 320 and 330 are coupled in series to respective ones of capacitor switches 311, 321 and 331. In a case that one of capacitor switches 311, 321 and 331 is completely "closed" (i.e., its gate voltage results in a minimum drain-to-source resistance), current may flow substantially freely from a respective capacitor to ground. The respective capacitor therefore contributes substantially its entire characteristic capacitance to the total capacitance of capacitors 310, 320 and 330.

One of capacitor switches 311, 321 and 331 is "open" if its gate voltage prevents substantially any current from flowing to ground from a respective capacitor. In such a case, the respective capacitor contributes negligibly to the total capacitance of capacitors 310, 320 and 330. Therefore, as the resistance provided by a capacitor switch decreases, an increased percentage of a respective capacitor's characteristic capacitance is contributed to the total capacitance. In some embodiments, the quality factor ("Q") of the contributed capacitance also increases as the capacitor switch resistance decreases.

The total capacitance may equal the sum at node A of the effective capacitances contributed by each capacitor 310, 320 and 330. The total capacitance is the output capacitance of circuit 130 that is contributed to VCO 150, which is coupled to node A. Since a frequency of an oscillating signal output by VCO 150 is based at least on the output capacitance of circuit 130, the frequency may be changed by changing the total capacitance provided at node A. In some embodiments, the total capacitance provided at node A may be changed without significantly changing the Q of VCO 150.

Capacitor switches 311, 321 and 331 are coupled to respective ones of control circuits 312, 322 and 332. Each of control circuits 312, 322 and 332 may generate a respective control voltage ($V_{control}$), and may set a respective capacitor switch to the generated control voltage.

The respective control voltage determines a source-to-drain resistance of a respective capacitor switch. The control voltage therefore determines an effective capacitance of a respective capacitor that is contributed to the output capacitance at node A. More particularly, the resistance provided by a capacitor switch decreases as its control voltage increases, and, as a result, an increased percentage of its respective capacitor's characteristic capacitance is contributed to the total capacitance.

Each of control circuits 312, 322 and 332 may be coupled to a respective one of control switches 313, 323 and 333. Each of control switches 313, 323 and 333 may couple and decouple a respective control circuit to control signal $I_{control}$, and control circuits 312, 322 and 332 may generate a respective control voltage based at least on $I_{control}$.

A set of biasing circuits is coupled to each control circuit 312, 322 and 332 in order to set a respective control voltage to a reset voltage, a first threshold voltage, and a second threshold voltage. For example, biasing circuit 314 may set control voltage $V_{control1}$ to a first threshold voltage $V_L$, biasing circuit 315 may set control voltage $V_{control1}$ to a reset voltage $V_R$, and biasing circuit 316 may set control voltage $V_{control1}$ to a second threshold voltage $V_H$. In the present example, the voltages serve to change a series resistance between capacitor 310 and ground. As described above, a change in the resistance between capacitor 310 and ground changes an amount of the characteristic capacitance of capacitor 310 that is contributed to the output capacitance at node A.

According to some embodiments, the first threshold voltage "opens" capacitor switch 311. The first threshold voltage therefore causes capacitor 310 to contribute negligibly to the output capacitance at node A. The second threshold voltage "closes" capacitor switch 311, resulting in substantially all the characteristic capacitance of capacitor 310 to be contributed to the output capacitance.

The reset voltage may be a voltage that causes capacitor switch 311 to present capacitor 310 with a resistance between 0 and infinity. This resistance may be in the middle of the resistive range of capacitor switch 311. In some embodiments, the first threshold voltage is a voltage at which any further decrease in $V_{control1}$ would not increase a resistance of capacitor switch 311, the second threshold voltage is a voltage at which any further increase in $V_{control1}$ would not decrease a resistance of capacitor switch 311, and the reset voltage is equal to a voltage between the first and second threshold voltages, such as an average of the first and second voltages. Relationships between the biasing circuits coupled to capacitor switches 321 and 331 may be similar to those described with respect to switch 311 and circuits 314 through 316.

In operation, one of control circuits 312, 322 and 332 is uncoupled from its associated biasing circuits and control signal $I_{control}$ is selectively coupled to only the one control circuit using control switches 313, 323 and 333. The coupled control circuit therefore generates a control voltage $V_{control}$ based on $I_{control}$, and the control voltage is applied to an associated capacitor switch. A resistance of the capacitor switch may change in response to a change in the control voltage, and the change in resistance may change a capacitance that an associated capacitor contributes to the output capacitance at node A. The capacitance that the associated capacitor contributes to the output capacitance therefore varies based on $I_{control}$. The capacitor switch is set to the first or second threshold voltage by a biasing circuit once the control voltage reaches either threshold voltage, and the process repeats for another control circuit.

Figure 4:
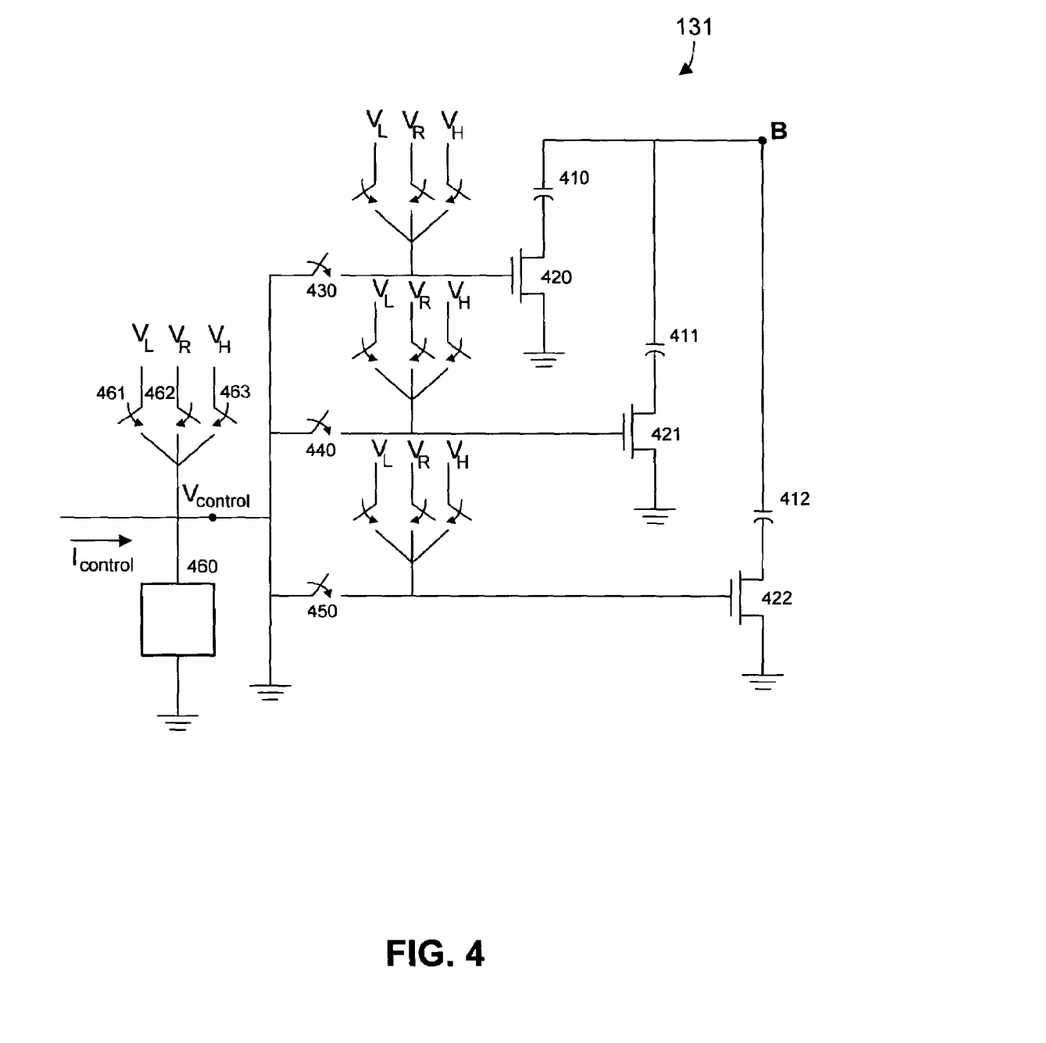
FIG. 4 is a schematic diagram of a switch capacitor circuit according to some embodiments.

FIG. 4 is a schematic diagram of circuit 131 according to some embodiments. Circuit 131 may be substituted for circuit 130 in some embodiments. Circuit 131 is described in detail in commonly-owned, co-pending U.S. patent application Ser. No. 10/601,984, entitled SYSTEM TO VARY CAPACITANCE BASED ON A CONTROL SIGNAL and filed on Jun. 23, 2003, the contents of which are incorporated herein by reference.

Briefly, circuit 131 also includes capacitors 410, 411 and 412 coupled in parallel to each other and coupled in series to respective ones of capacitor switches 420, 421 and 422 as described above. The output capacitance of circuit 131 that is contributed to VCO 150 may equal the sum at node B of the effective capacitances contributed by each capacitor 410, 411 and 412. The frequency of the oscillating signal output by VCO 150 may be changed by changing the total capacitance provided at node B.

Capacitor switches 420, 421 and 422 are respectively coupled to control switches 430, 440 and 450. Control switches 430, 440 and 450 may couple and decouple a respective capacitor switch to a control voltage. Control circuit 460 generates the control voltage ($V_{control}$) based on $I_{control}$ received from charge pump 120. Control biasing circuits 461, 462 and 463 are coupled to control circuit 460. Biasing circuit 461 may set $V_{control}$ to a first threshold voltage $V_L$, biasing circuit 462 may set $V_{control}$ to a reset voltage $V_R$, and biasing circuit 463 may set $V_{control}$ to a second threshold voltage $V_H$.

During operation, one of capacitor switches 420, 421 and 422 is uncoupled from its associated biasing circuits and is coupled to $V_{control}$ using control switches 430, 440 and 450. Control circuit 460 is also uncoupled from control biasing circuits 461, 462 and 463. Control circuit 460 therefore generates $V_{control}$ based on $I_{control}$ received from charge pump 120, and $V_{control}$ is applied to the uncoupled capacitor switch. As described above, a resistance of the capacitor switch may change in response to a change in the control voltage, and the change in resistance may change a capacitance that an associated capacitor contributes to the output capacitance at node B. Moreover, the capacitance that the associated capacitor contributes to the output capacitance varies based on $I_{control}$. The coupled capacitor switch is set to the first or second threshold voltage by a biasing circuit once the control voltage reaches either threshold voltage, and the above process is repeated for another capacitor switch.

Other switch capacitor circuits may be used in conjunction with some embodiments. For example, switch capacitor circuit 130 may "hard switch" capacitors into an output capacitance based on a threshold detect (and reset) on integration.

At some point during operation, it is determined that the output capacitance of switch capacitor circuit 130 is oscillating between two capacitance values. Such oscillation may occur because the granularity of switch capacitor circuit 130 may not be fine enough to provide VCO 150 with an output capacitance necessary to achieve the desired output frequency. Once it is determined that an output capacitance of switch capacitor circuit 130 is oscillating, switch capacitor circuit 130 is uncoupled from control signal $I_{control}$ at 204 by opening switch 135. In some embodiments, the uncoupling of switch capacitor circuit 130 from control signal $I_{control}$ fixes the value of the output capacitance to the value present at the time of the uncoupling.

Main loop circuit 140 is coupled to control signal $I_{control}$ at 205. Some embodiments of 205 comprise closing switch 145. Main loop circuit 140 may generate and transmit a voltage signal to VCO 150 in response to control signal $I_{control}$. Many main loop circuits having this ability are known in the art, and any suitable currently- or hereafter-known main loop circuit may be used in conjunction with some embodiments. VCO 150 may convert the voltage signal to a current signal, which is then used to affect the frequency of the oscillating signal $f_{out}$.

Figure 5:
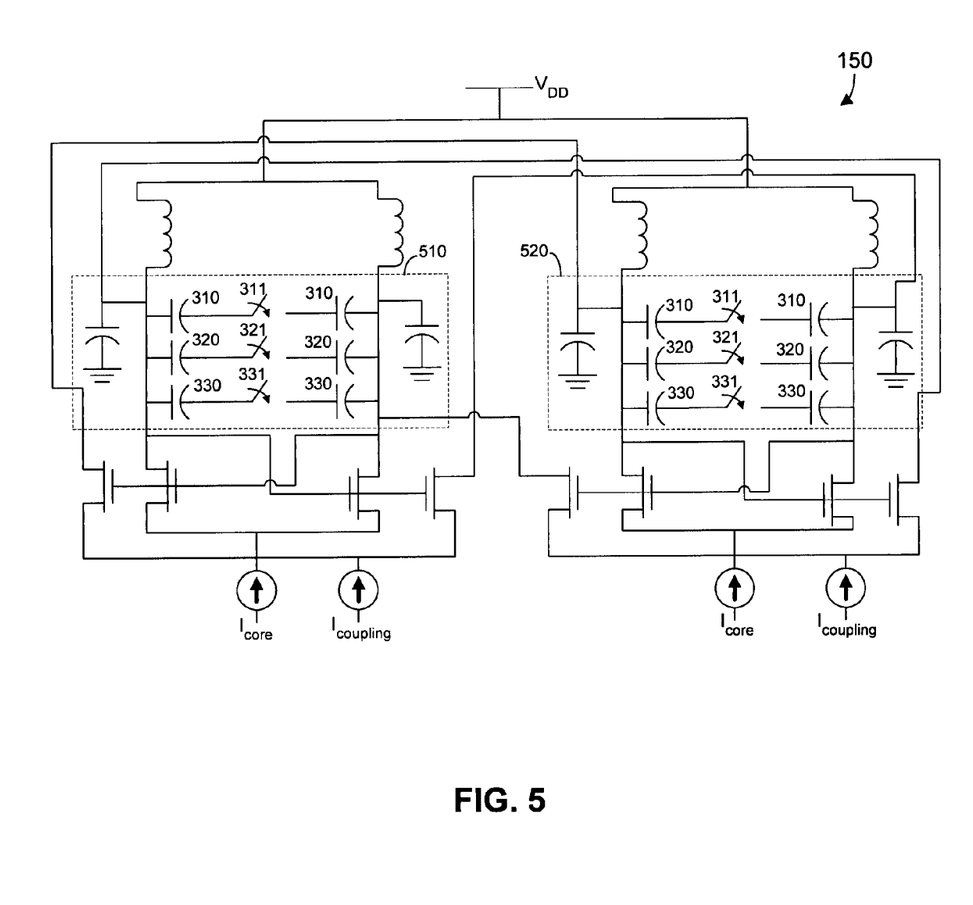
FIG. 5 is a schematic diagram of a VCO according to some embodiments.

FIG. 5 is a schematic diagram of VCO 150 according to some embodiments. VCO 150 outputs signal $f_{out}$ having a frequency based at least on an output capacitance of switch capacitor circuit 130 and on a voltage signal received from main loop circuit 140.

VCO 150 of FIG. 5 is a differential-mode LC tank-based VCO known to those of ordinary skill. An output frequency of oscillation of VCO 150 is based at least on output-controlling capacitances 510 and 520. As shown, output-controlling capacitances 510 and 520 include capacitors 310, 320 and 330 and respective capacitor switches 311, 321 and 331 of FIG. 3. In contrast to the single-ended embodiment of FIG. 3, capacitors 310, 320 and 330 are shown in a differential-mode configuration in FIG. 5. As described with respect to FIG. 3, capacitors 310, 320 and 330 of FIG. 5 provide capacitance to VCO 150 based on voltage-controlled series resistances of capacitor switches 311, 321 and 331.

The frequency of $f_{out}$ is also based on $I_{core}$ and $I_{coupling}$. $I_{core}$ and $I_{coupling}$ are received from one or more voltage-to-current converters (not shown) that in turn receive the voltage signal from main loop circuit 140. The voltage signal received from circuit 140 may therefore be a differential signal. As a result, the frequency of $f_{out}$ is based on the received voltage signal. According to some embodiments, the output frequency of VCO 150 is alternatively or additionally based on a capacitive element such as a varactor or variable capacitor that provides a capacitance based on a voltage signal. Some embodiments may be used in conjunction with any suitable VCO, including but not limited to those based on an RC ring oscillator, an LC tank, an RC tank, and any other type of oscillating circuit.

After main loop circuit 140 is coupled to control signal $I_{control}$, elements 110, 120, 140, 150 and 160 operate as described above to attempt to "lock" the frequency of $f_{out}$ to $N(f(f_{in}))$. During this operation, it is periodically or continuously determined at 206 whether main loop circuit 140 has reached a threshold point in its tuning range. A threshold point may be reached if main loop circuit 140 is not broad enough to track jitter in $f_{in}$, due to frequency offset issues, or for other reasons. The threshold point may comprise an operation point at which the control voltage transmitted by circuit 140 is as low or as high as possible. The threshold point may comprise other operation points near to the above-described operation points. Comparators (not shown) may monitor the output of circuit 140 in order to execute the determination at 206.

Flow proceeds to 207 if the determination in 206 is affirmative. At 207, the output capacitance of switch capacitor circuit 130 is changed. The change may be intended to move the present operation point of main loop circuit 140 toward the center of its operating range. In some embodiments, main loop circuit 140 transmits a signal to switch capacitor circuit 130 at 207 instructing switch capacitor circuit 130 to add or subtract from its output capacitance. The change in the output capacitance may change a frequency of $f_{out}$, which may in turn change control signal $I_{control}$ that is still coupled to circuit 140. The change in control signal $I_{control}$ may move the operating point of main loop circuit 140.

Flow pauses at 208 in order to provide time for PLL 100 to reach a steady state after 208. The duration of the pause may be based at least on the switch time and/or the bandwidth of main loop circuit 140. Flow then returns to 206 to determine whether main loop circuit 140 is still at a threshold point in its tuning range. If so, the output capacitance of circuit 130 may again be changed at 207. Flow therefore continues to cycle through 206, 207 and 208 while PLL 100 remains in operation.

In some embodiments of 207, the voltage signal output by main loop filter 140 is held at its present value and $I_{control}$ is re-coupled to switch capacitor circuit 130 by opening switch 145 and closing switch 135. Next, an operating point of main loop circuit 140 could be slowly changed by applying a slow effective dV/dt thereto. This change may cause circuit 140 to generate an output voltage signal that is near the center of its operating range of control voltages.

Some embodiments provide for different modes of operation. For example, the gain and/or bandwidth of each of circuits 130 and 140 may be programmable for use in various scenarios. In some scenarios, switch capacitor circuit 130 is a high-gain, high-bandwidth, high-noise filter circuit and main loop circuit 140 is a low-gain, low-bandwidth, low-noise filter circuit. Such embodiments may provide wide tuning range, low-noise differential main loop control, continued capacitance-based control over the VCO even after frequency acquisition, and efficient tracking of high-speed jitter and leftover offset frequencies without battling feedback loops.

Figure 6:
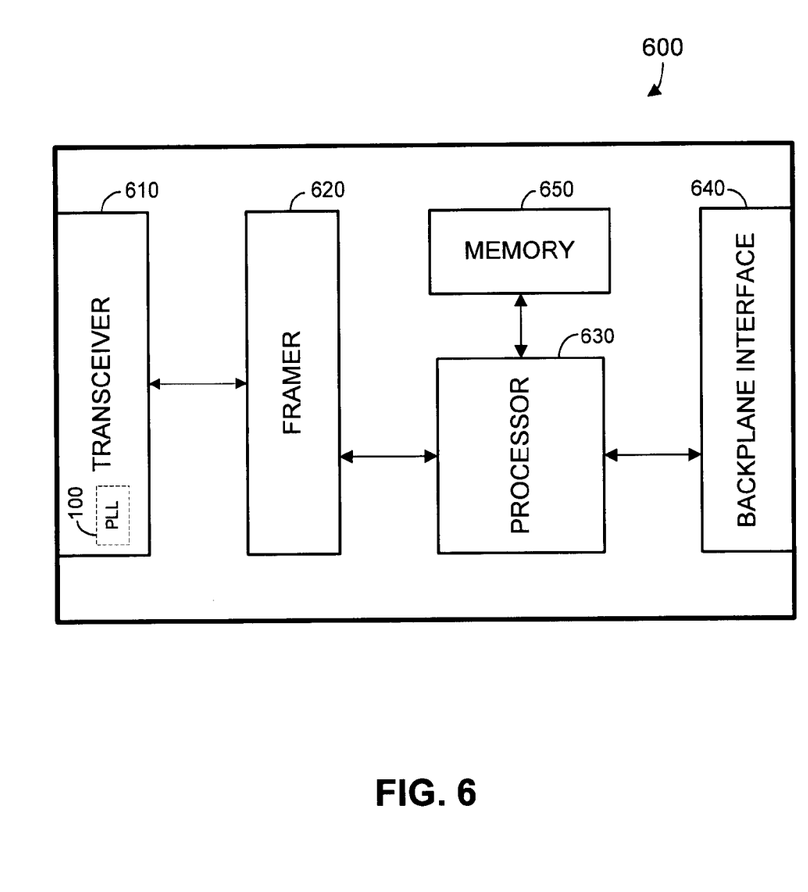
FIG. 6 is a block diagram of a line card according to some embodiments.

FIG. 6 is a block diagram of line card 600 according to some embodiments. Line card 600 may provide an interface between a main backplane and an optical network. Line card 600 may comprise a circuit board onto which the illustrated elements are mounted. The elements include transceiver 610, framer 620, processor 630, backplane interface 640, and memory 650.

Transceiver 610 may be an optical transceiver including elements for transmitting and receiving data over an optical physical layer. A transmitting section of transceiver 610 may comprise PLL 100 of FIG. 1. A receiving section may include a Clock and Data Recovery Unit that also incorporates PLL 100. Transceiver 610 may also comprise a serial/deserializer to process outgoing/incoming data.

Framer 620 may receive and decapsulate encapsulated data that is received by the receiving section of transceiver 610. Framer 620 may also encapsulate data received from processor 630 prior to transmitting the encapsulated to transceiver 620. Processor 630 receives/transmits data from/to backplane interface 640, which communicates with a network server or a network switch backplane. Memory 650 is in communication with processor 630 and may comprise a Double Data rate Random Access Memory, a Quad Data rate Random Access Memory, or any other suitable memory.

Memory 650 may store code executable by processor 630 and/or other data for use by processor 630.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A method comprising:
   receiving a control signal from a charge pump;
   coupling a switch capacitor circuit to the control signal using a first switch;
   determining that an output capacitance of the switch capacitor circuit generated based on the control signal is oscillating;
   uncoupling the switch capacitor circuit from the control signal using the first switch to set a first output capacitance of the switch capacitor circuit; and
   coupling a main loop circuit to the control signal using a second switch to generate an output signal based on the control signal,
   wherein a frequency of an oscillating signal output by an oscillating circuit is based at least on the first output capacitance and on the output signal generated by the main loop circuit, and
   wherein the control signal is based on a frequency of an oscillating signal output from the oscillating circuit and a reference frequency.

2. A method according to claim 1, further comprising:
   receiving a reference signal representing the reference frequency;
   receiving a first signal having a first frequency, the first frequency based on the frequency of the oscillating signal;
   determining a difference between the reference frequency and the first frequency; and
   transmitting a signal to the charge pump based on the difference.

3. A method according to claim 1, further comprising:
   setting the main loop circuit to substantially a center of its tuning range before coupling the switch capacitor circuit to the control signal.

4. A method according to claim 1, further comprising:
   determining if the main loop circuit has reached a threshold point in its tuning range; and
   changing the first output capacitance to a second output capacitance if it is determined that the main loop circuit has reached the threshold point in its tuning range.

5. A method according to claim 4, further comprising:
   again determining if the main loop circuit has reached the threshold point in its tuning range; and
   changing the second output capacitance to a third output capacitance if it is again determined that the main loop circuit has reached the threshold point in its tuning range.

6. A method according to claim 4, wherein changing the first output capacitance comprises:
   transmitting a signal from the main loop circuit to the switch capacitor circuit.

7. An apparatus comprising:
   a charge pump to generate a control signal;
   a switch capacitor circuit to generate a first output capacitance based on the control signal;
   a main loop circuit to generate an output signal based on the control signal;

an oscillating circuit to generate an oscillating signal, a frequency of the oscillating signal based at least on the first output capacitance and the output signal;

a first switch to couple the switch capacitor circuit to the control signal and to decouple the switch capacitor circuit from the control signal; and a second switch to couple the main loop circuit to the control signal and to decouple the main loop circuit from the control signal, wherein the control signal is based on the frequency of the oscillating signal and on a reference frequency.

8. An apparatus according to claim 7, further comprising:

a detector to receive a reference signal representing the reference frequency, to receive a first signal having a first frequency, the first frequency based on the frequency of the oscillating signal, to determine a difference between the reference frequency and the first frequency, and to transmit a signal to the charge pump based on the difference.

9. An apparatus according to claim 8, wherein the first switch is to uncouple the switch capacitor circuit from the control signal if it is determined that an output capacitance of the switch capacitor circuit is oscillating; and wherein the second switch is to couple the main loop circuit to the control signal if it is determined that the output capacitance of the switch capacitor circuit is oscillating.

10. An apparatus according to claim 7, wherein the first switch is to uncouple the switch capacitor circuit from the control signal if it is determined that an output capacitance of the switch capacitor circuit is oscillating; and wherein the second switch is to couple the main loop circuit to the control signal if it is determined that the output capacitance of the switch capacitor circuit is oscillating.

11. An apparatus according to claim 7, the capacitor switch circuit to change the first output capacitance to a second output capacitance if it is determined that the main loop circuit has reached a threshold point in its tuning range.

12. An apparatus according to claim 11, further comprising:

the capacitor switch circuit to change the second output capacitance to a third output capacitance if it is determined that the main loop circuit has reached the threshold point in its tuning range.

13. A system comprising:

a transceiver to transmit and receive data comprising:

a charge pump to generate a control signal;

a switch capacitor circuit to generate a first output capacitance based on the control signal;

a main loop circuit to generate an output signal based on the control signal;

an oscillating circuit to generate an oscillating signal, a frequency of the oscillating signal based at least on the first output capacitance and the output signal, the oscillating signal to be used to encode and decode the data;

a first switch to couple the switch capacitor circuit to the control signal and to decouple the switch capacitor circuit from the control signal; and a second switch to couple the main loop circuit to the control signal and to decouple the main loop circuit from the control signal, wherein the control signal is based on the frequency of the oscillating signal and on a reference frequency;

a processor to process the data; and a double data rate memory in communication with the processor.

14. A system according to claim 13, further comprising:

a detector to receive a reference signal representing a reference frequency, to receive a first signal having a first frequency, the first frequency based on the frequency of the oscillating signal, to determine a difference between the reference frequency and the first frequency, and to transmit a signal to the charge pump based on the difference.

15. A system according to claim 13, wherein the first switch is to uncouple the switch capacitor circuit from the control signal if it is determined that an output capacitance of the switch capacitor circuit is oscillating; and wherein the second switch is to couple the main loop circuit to the control signal if it is determined that the output capacitance of the switch capacitor circuit is oscillating.

16. A system according to claim 13, further comprising:

a framer coupled to the transceiver and to the processor, the framer to decapsulate data received by the transceiver and to encapsulate data to be transmitted by the transceiver.

* * * * *